US010989768B2

(12) United States Patent
Honkura et al.

(10) Patent No.: US 10,989,768 B2
(45) Date of Patent: Apr. 27, 2021

(54) ULTRA HIGH-SENSITIVITY MICRO MAGNETIC SENSOR

(71) Applicant: ASAHI INTECC CO., LTD., Seto (JP)

(72) Inventors: Yoshinobu Honkura, Aichi (JP); Shinpei Honkura, Aichi (JP)

(73) Assignee: ASAHI INTECC CO., LTD., Seto (JP)

( * ) Notice: Subject to any disclaimer, the term of this patent is extended or adjusted under 35 U.S.C. 154(b) by 0 days.

(21) Appl. No.: 16/714,830

(22) Filed: Dec. 16, 2019

(65) Prior Publication Data

US 2020/0116803 A1    Apr. 16, 2020

Related U.S. Application Data

(63) Continuation of application No. PCT/JP2018/019392, filed on May 18, 2018.

(30) Foreign Application Priority Data

Jun. 16, 2017 (JP) .............................. JP2017-119171

(51) Int. Cl.
*G01R 33/07* (2006.01)
*G01R 33/12* (2006.01)

(52) U.S. Cl.
CPC ....... *G01R 33/075* (2013.01); *G01R 33/1284* (2013.01)

(58) Field of Classification Search
CPC .. G01R 33/075; G01R 33/1284; G01R 33/02; H01L 29/82; H01L 43/00
USPC ....................................................... 324/252
See application file for complete search history.

(56) References Cited

U.S. PATENT DOCUMENTS

| 3,911,389 | A | * | 10/1975 | Mills | G08G 1/042 |
| | | | | | 340/941 |
| 4,611,169 | A | * | 9/1986 | Hermann | G01V 3/108 |
| | | | | | 104/284 |
| 5,442,283 | A | * | 8/1995 | Vig | G01P 3/489 |
| | | | | | 324/207.2 |
| 6,121,770 | A | * | 9/2000 | Sudo | G01R 33/02 |
| | | | | | 324/244 |

(Continued)

FOREIGN PATENT DOCUMENTS

| EP | 3447514 A1 | 2/2019 |
| JP | 2016-003866 A | 1/2016 |

(Continued)

OTHER PUBLICATIONS

Vázquez, M., Badidni-Confalonieri, G., Torrejón, J., Valenzuela, R., Montiel, H. and Alvarez, G., 2009, Feb. Low-field microwave phenomena in CoFeSiB amorphous magnetic microwires. In 2009 Third International Conference on Quantum, Nano and Micro Technologies (pp. 134-137). IEEE. (Year: 2009).*

(Continued)

*Primary Examiner* — Christopher P McAndrew
(74) *Attorney, Agent, or Firm* — Xsensus LLP

(57) ABSTRACT

A magnetic sensor, comprising: a substrate having a groove; two conductive magnetic wires for magnetic field detection arranged adjacent and substantially parallel to one another and at least partially recessed in the groove on the substrate, the two conductive magnetic wires electrically coupled at one end; a coil surrounding the two magnetic wires; two electrodes coupled to the two conductive magnetic wires for wire energization; and two electrodes coupled to the coil for coil voltage detection.

18 Claims, 11 Drawing Sheets

(56) References Cited

U.S. PATENT DOCUMENTS

| | | | |
|---|---|---|---|
| 6,194,897 B1* | 2/2001 | Fukunaga | G01R 33/04 324/253 |
| 7,535,221 B2* | 5/2009 | Satoh | G01R 33/0206 324/253 |
| 7,755,360 B1* | 7/2010 | Martin | G01V 3/15 324/326 |
| 7,834,620 B2* | 11/2010 | Kejik | G01R 33/04 324/253 |
| 8,237,438 B2 | 8/2012 | Bazinet | |
| 8,378,670 B1 | 2/2013 | Honkura et al. | |
| 9,404,980 B2 | 8/2016 | Honkura | |
| 9,857,436 B2 | 1/2018 | Honkura | |
| 10,539,701 B2 | 1/2020 | Kawano et al. | |
| 2007/0016006 A1* | 1/2007 | Shachar | A61B 5/062 600/424 |
| 2010/0156394 A1* | 6/2010 | Ausserlechner | G01R 19/0092 324/144 |
| 2011/0089512 A1* | 4/2011 | Honkura | G01R 33/18 257/427 |
| 2012/0038358 A1* | 2/2012 | Honkura | G01R 33/063 324/252 |
| 2013/0142566 A1* | 6/2013 | Yu | H01L 24/49 403/271 |
| 2014/0247094 A1* | 9/2014 | Englund | H03B 17/00 331/94.1 |
| 2014/0306709 A1* | 10/2014 | McCamey | G01R 33/09 324/316 |
| 2016/0238673 A1* | 8/2016 | Honkura | G01R 33/1292 |
| 2017/0100051 A1* | 4/2017 | Honkura | G01R 33/022 |

FOREIGN PATENT DOCUMENTS

| | | |
|---|---|---|
| JP | 5839527 B1 | 1/2016 |
| WO | 2015060344 A1 | 10/2013 |

OTHER PUBLICATIONS

Office Action dated Mar. 3, 2020, issued in corresponding Singapore Patent Application No. 11201911920V, 6 pages.

* cited by examiner

ULTRA HIGH-SENSITIVITY MICRO MAGNETIC SENSOR

CROSS REFERENCES TO RELATED APPLICATIONS

This application is a bypass continuation of PCT filing PCT/JP2018/019392, filed on May 18, 2018, which claims priority to Japanese Patent Application No. 2017-119171, filed on Jun. 16, 2017, the entire contents of each are incorporated herein by reference.

TECHNICAL FIELD

The present disclosure relates to a technology of improving sensitivity characteristics of a GSR (GHz-Spin-Rotation) sensor by adopting rising pulse detection. Here, the GSR sensor is a ultra high-sensitivity micro magnetic sensor based on the GHz spin rotation effect.

BACKGROUND

High-sensitivity micro magnetic sensors includes a horizontal FG (Fluxgate) sensor, a vertical FG sensor, a hole sensor, a GMR (Giant-Magneto-Resistance) sensor, a TMR (Tunnel-Magneto-Resistance) sensor, a MI (Magneto-Impedance) sensor, a GSR sensor, a high frequency carrier sensor, and the like. These sensors are currently used widely in smartphones, vehicles, medical treatment, robots, and the like. Among the above-described sensors, the GSR sensor is excellent in sensitivity and size, and draws the most attention.

To achieve remote control of an in vivo motion device, an investigation is currently advanced for finding a position and a direction by providing a three-dimensional magnetic sensor utilizing a GSR sensor. The sensor is preferably smaller to provide it in a motion device. However, the detection sensitivity is deteriorated inversely proportional thereto. Furthermore, with the restriction of a supply power source, the reduction of power consumption during measurement has been demanded.

CITATION LIST

Patent Literature

Patent Literature 1: Japanese Patent No. 5839527

SUMMARY

The present application describes a magnetic sensor, comprising: a substrate having a groove; two conductive magnetic wires for magnetic field detection arranged adjacent and substantially parallel to one another and at least partially recessed in the groove on the substrate, the two conductive magnetic wires electrically coupled at one end; a coil surrounding the two magnetic wires; two electrodes coupled to the two conductive magnetic wires for wire energization; and two electrodes coupled to the coil for coil voltage detection.

DETAILED DESCRIPTION

For GSR sensors there currently exist two detection methods—rising pulse detection and falling pulse detection. In rising pulse detection, the magnetic field sensitivity is about 2.5 times as high as that for falling pulse detection, which shortens pulse time and reduces power consumption. However, the linearity has typically been about 1 to 2% and has been inferior to the linearity achievable with falling pulse detection of 0.5% or lower.

The embodiments of the present disclosure are aimed at achieving the advantages of rising pulse detection (high magnetic field sensitivity, for example) while attaining a linearity of 0.5% or less.

A coil output voltage (hereinafter, referred to as a coil voltage) of the GSR sensor may include two kinds of voltages: (1) an induced voltage dependent on a pulse current (referred to as an "a voltage") and (2) a voltage dependent on an external magnetic field (referred to as a "b voltage"). Comparing rising pulse detection and falling pulse detection, the peaks of the two voltage are temporally closer to one another in the case of falling pulse detection, and the influence by a pulse current is larger. Moreover, the MI (Magneto-Impedance) effect changes the impedance of magnetic wires by a magnetic field. As a result, the "a voltage" dependent on a pulse current is also influenced by the magnetic field, and may not be easily canceled. That is, if the "a voltage" is not influenced by a magnetic field, the "a voltage" may be measured with H=0G, and a net "b voltage" may thus be detected by cancelling the "a voltage".

Removing an induced voltage dependent on a pulse current from a coil voltage found by rising pulse detection has been a difficult problem.

Figure 7:
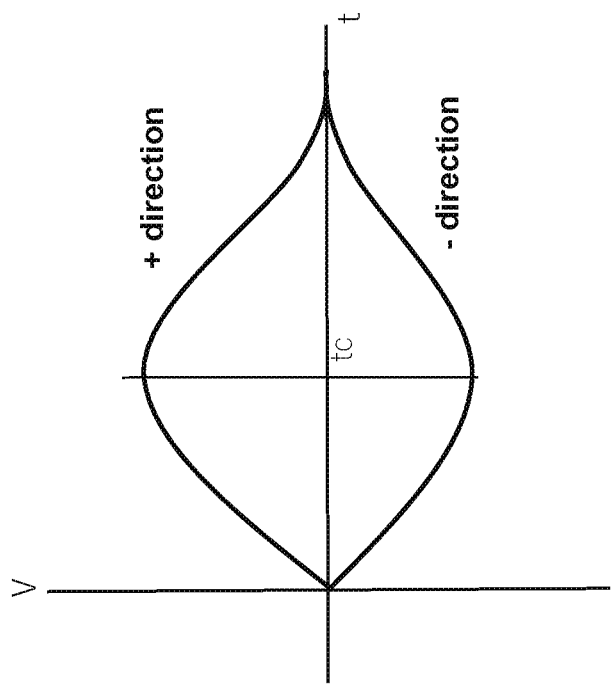
FIG. 7 illustrates a diagram, according to an embodiment, of an output voltage V when two magnetic wires are subjected to a pulse current in opposite directions (+ direction and − direction) when an external magnetic field H=0.
Figure 8:
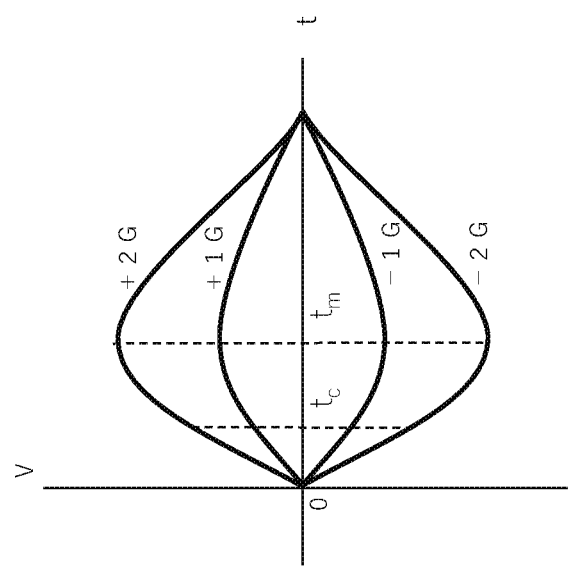
FIG. 8 illustrates a diagram of an output voltage V when an external magnetic field H=−2G to +2G.

In some embodiments of the present disclosure, a magnetic field detection element comprises two magnetic wires surrounded by a coil, along with appropriate electrodes attached to the ends of the magnetic wires and the coil. A pulse current may be applied to the two magnetic wires in opposite directions. In such embodiments, a coil induced voltage using rising pulse detection becomes 0 when H=0 G (FIG. 7). Additionally, if an electric current is applied in opposite directions, in such embodiments, for the case where a magnetic field H is present, the coil voltage is not changed and only the "b voltage" is detected (FIG. 8). That is, the "a voltage" is canceled.

Furthermore, in some embodiments, a measurement of the "b voltage" where a changing magnetic field is present, the voltage is linearly output symmetrically relative to the polarity of the magnetic field with a linearity of 0.3% or lower.

Figure 9:
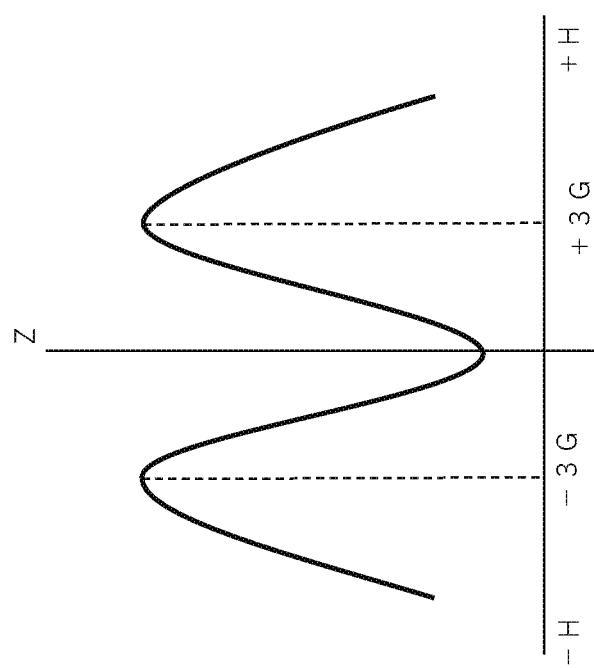
FIG. 9 illustrates a diagram, according to an embodiment, of a relationship between an external magnetic field H and an impedance Z.

In some embodiments, when the magnetic field H is changed from zero, the "a voltage" is canceled. This is because the impedance of the two wires is changed symmetrically relative to the magnetic field H, regardless of a direction of an electric current, and thus the impedance thereof is constant and a pulse current flowing in the two wires is the same, which cancels the influence on their coils even when a magnetic field is changed (FIG. 9).

In the case of rising pulse detection, the detection may be performed with the rising pulse edge, which allows pulse time of 1 ns (1 nanosecond) or shorter. This contrasts with the case of falling pulse detection where the detection must be performed after the rising coil voltage is attenuated completely. Thus, the pulse time must be maintained for about 10 ns. Therefore, for embodiments using rising pulse detection, the pulse current consumption may be less than 10% of the pulse current consumption for falling pulse detection.

Figure 10:
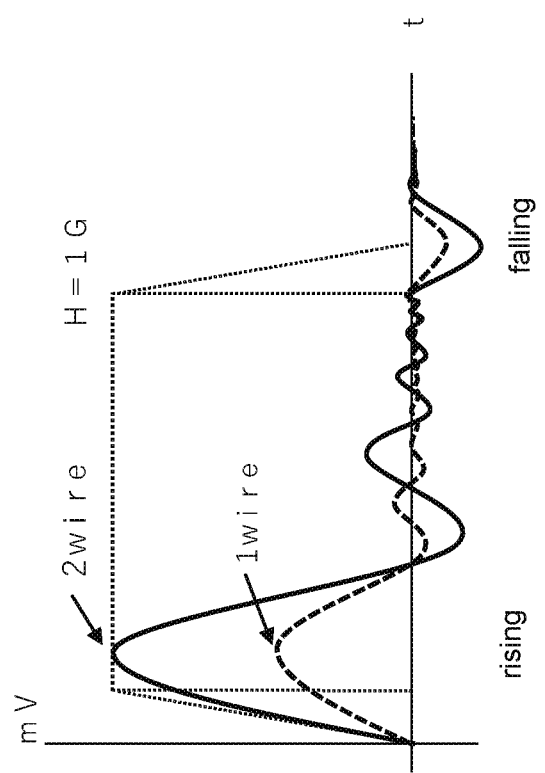
FIG. 10 illustrates a diagram of a coil output voltage in rising pulse detection and falling pulse detection with one magnetic wire and two magnetic wires according to an embodiment.
Figure 11:
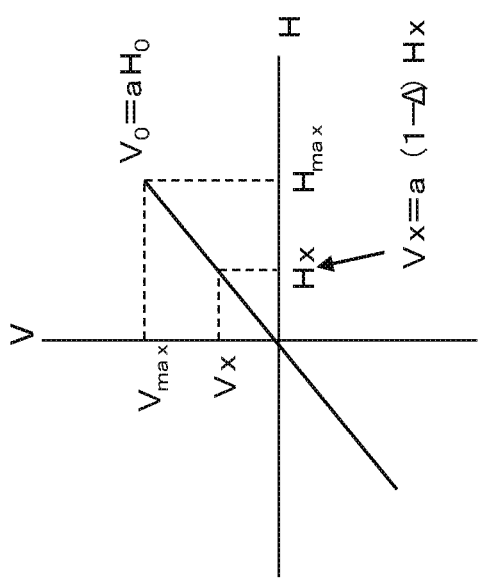
FIG. 11 illustrates a diagram, according to an embodiment, of the linearity P in relation between the change of the external magnetic field and the output.

The coil voltage of an element including two magnetic wires for embodiments of the present disclosure is twice the coil voltage of an element including one magnetic wire. Moreover, the coil voltage in rising pulse detection is 2.5 times the coil voltage in falling pulse detection (FIG. 10). As compared with the GSR sensor described in Patent Literature 1, the coil voltage may be as much as five times greater with an element of the same size.

In some embodiments, the relation between the coil voltage and the external magnetic field is the same as the equation in the GSR sensor described in Patent Literature 1. That is, $$Vs = Vo \cdot 2L \cdot \pi D \cdot p \cdot Nc \cdot f \sin(\pi H / 2Hm) \quad (1)$$

Here, Vs is a coil voltage, and Vo is a constant of proportionality determined by wire magnetic permeability, magnetic characteristics of wire materials with saturation magnetic flux density, and a pulse current. As a control factor constant, L is a wire length, D is a wire diameter, p is a skin depth of a pulse current, Nc is the number of windings of a coil, f is a pulse frequency, H is an external magnetic field, Hm is an external magnetic strength to obtain the maximum coil output voltage.

By applying an arcsine transformation to both sides of equation (1) and letting the resultant value be a conversion voltage V', the following equations (2) and (3) are obtained:

$$V' = \arcsin(Vs/Vo \cdot 2L \cdot \pi D \cdot p \cdot Nc \cdot f) = (\pi \cdot \frac{1}{2}Hm) \cdot H \quad (2)$$

$$H = 2Hm/\pi \times V' \quad (3)$$

H is found on the basis of expression (3).

V' varies linearly from −Hm to +Hm relative to the magnetic field H. The measurement range is Hm, and is about four times that in the case without arcsine transformation. Note that when Vx=a(1−Δ)Hx, the linearity P is defined as P=100×Δ(%).

That is, the linearity is defined on the basis of a deviation amount Δ from the equation Vx=aHx when Δ=0.

Figure 12:
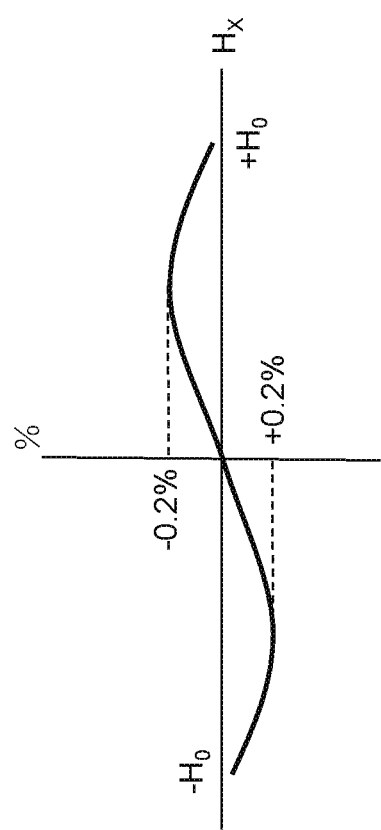
FIG. 12 illustrates a diagram of a relationship between a magnetic field Hx and a deviation amount in the rising pulse of a GSR sensor.

Furthermore, in some embodiments, the linearity may be as low as 0.2%, which is more preferable than 0.5% that is a deviation amount for falling pulse detection with a GSR sensor (FIG. 12).

In some embodiments, a GSR sensor may strengthen the electromagnetic coupling between the magnetic wire and the coil with the interval between the magnetic wire and the coil inner diameter of 3 μm or smaller. Also in the embodiments disclosed herein, the same relation remains except for the interval between the two magnetic wires.

In some embodiments, an electronic circuit similar to that in Patent Literature 1 may be used. The pulse frequency of a pulse current applied to the magnetic wire is in a range from 0.2 GHz to 4 GHz. The pulse current has the strength required to generate on the surface of a magnetic wire over a 1.5 times larger circumferential magnetic field than the magnetic anisotropy field.

The coil voltage occurring at the time of pulse energization may be fed to a sample and hold circuit through a pulse compliant buffer circuit. The pulse compliant buffer circuit in configured to preserve the fidelity of high speed pulses. With the small number of windings of the coil, the coil voltage may be fed directly to the sample and hold circuit.

The rising pulse may be detected using an electronic switch at the peak timing of a coil output waveform. In some embodiments, where the "a voltage" is canceled, the temporal timing of the peak voltage is constant without being dependent on the magnetic field H. If the "a voltage" is not canceled, the peak timing may change depending on the magnetic field H. Thus, strictly speaking, it is not possible to adjust the detection at the peak timing of a coil output waveform. This causes nonlinearity.

The capacitance of the sample and hold circuit capacitor may be in a range from about 4 pF to about 100 pF. It is preferable that the intervals between on and off of the electronic switch is shortened as much as possible to also reduce the capacitor capacitance to a range of about 4 pF to about 8 pF. In this manner, the voltage at the peak timing is held by the capacitor as an instantaneous voltage value. The held capacitor voltage may be output through a programming amplifier.

Embodiments of the disclosure will be described in detail with reference to FIGS. 1 to 12.

Figure 2:
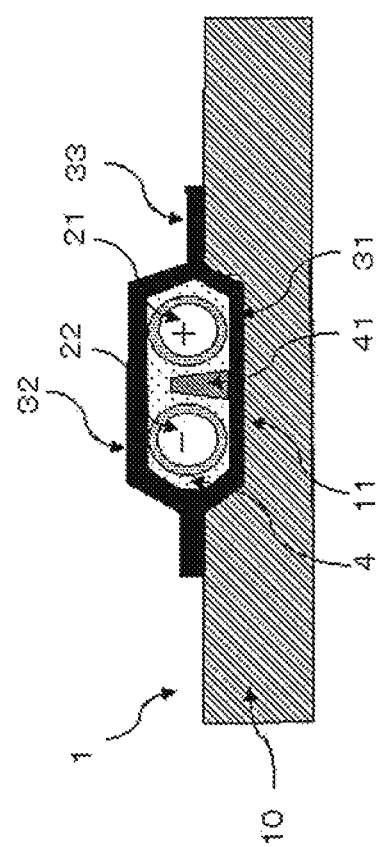
FIG. 2 illustrates a section view of a GSR sensor element along line A1-A2 of FIG. 1.
Figure 1:
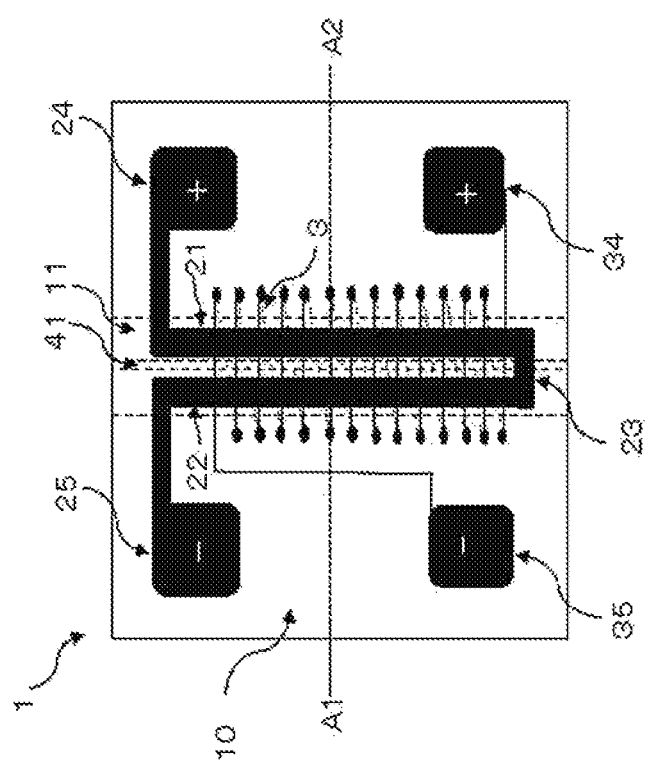
FIG. 1 illustrates a plane view of a GSR sensor element according to an embodiment.

FIGS. 1 and 2 illustrate the structure of a GSR sensor element 1 (magnetic field detection element) according to an embodiment of the current disclosure. Referring to FIG. 1, in an embodiment, a GSR sensor element 1 (hereinafter, referred to as an element) includes, on a substrate 10, two magnetic wires 21 and 22, one coil 3 surrounding the two magnetic wires 21 and 22, two electrodes 24 and 25 for wire energization, two electrodes 34 and 35 for coil voltage detection, a connection part 23 between the two magnetic wires 21 and 22. Moreover, the wire connection part 23 electrically connects the corresponding lower ends (illustrated in FIG. 1) of the two magnetic wires 21 and 22 and may facilitate the application of a pulse current to the two magnetic wires 21 and 22 in such a manner that the directions of the pulse current in each of the two magnetic wires 21 and 22 is opposite to one another. Then, the GSR sensor, in some embodiment, further includes a circuit 5 (FIG. 3) for detecting a coil voltage when a pulse current is applied and a circuit for converting a coil voltage into an output voltage representing the magnitude of the external magnetic field. The external magnetic field H and the coil voltage Vs are expressed by the mathematical relation of the above-described expression (1).

The width of the element 1 may be in the range from about 0.07 mm to about 0.4 mm and the length of element 1 may be in the range from about 0.25 mm to about 1 mm which is the size of the substrate 10. In the center part of element 1, the substrate 10 may have a groove 11 of about 20 μm to about 60 μm in width and about 2 μm to about 20 μm in depth so that the two magnetic wires 21 and 22 are at least partially recessed into the groove 11, aligned substantially straight, and disposed in close proximity to one another. The two magnetic wires 21 and 22 may be parallel to each other with a separation of from about 1 μm to about 5 μm. It is preferable that the magnetic wires 21 and 22 are isolated from each other by an insulating material, such as an insulating separation wall 41, for example.

The magnetic wires 21 and 21 may be formed of a CoFeSiB amorphous alloy with a diameter in the range of about 5 μm to about 20 μm. The periphery of the magnetic wires 21 and 21 is preferably coated with an insulating material, such as insulating glass, for example. The length of magnetic wires 21 and 21 may be in the range from about 0.07 mm to about 1.0 mm.

The magnetic wires 21 and 21 may have a magnetic anisotropy field of 20 G or less, with a two-phase magnetic domain structure of a surface magnetic domain with circumferential spin alignment and a center part core magnetic domain with axial spin alignment.

In the coil 3, it is preferable that the number of windings of the coil is in the range from about 6 to about 180 and the coil pitch is less than 10 μm. The space between the coil 3 and the magnetic wires 21 and 21 is preferably about 3 μm or less. The average inner diameter of the coil is preferably in the range from about 10 μm to about 35 μm.

In some embodiments, the element 1 may be fabricated as illustrated in FIG. 2. FIG. 2 illustrates a section view of a GSR sensor element 1 along line A1-A2 of FIG. 1.

Referring to FIG. 2, in an embodiment, electrode wiring may be performed on a lower coil 31 and the substrate surface along the groove 11 formed on the substrate 10. Then, an insulating separation wall 41 may be formed in the center part of groove 11 to have a two-groove form, and each of the two magnetic wires 21 and 22 coated with glass may be arranged therein. Next, an insulating resist may be applied to the entire surface of the substrate. Thus, the magnetic wires 21 and 22 may be fixed in the groove 11. The insulating resist may be applied thinly onto the upper part of the magnetic wires 21 and 22. An upper coil 32 may then be formed over the insulating resist by a photolithographic technology.

In embodiment where the magnetic wires 21 and 22 are not coated with glass, an insulating material 4 may be preliminarily applied to prevent electrical contact between the lower coil 31 and the magnetic wires 21 and 22.

In the manufacturing of the coil, the recessed lower coil 31 may be formed along the groove surface and both sides of the groove 11 formed on the substrate 10. The projecting upper coil 32 may be electrically connected to the lower coil through an interconnection part 33 to form the substantially helical coil 3.

At the ends of the two magnetic wires 21 and 22, some of the glass that forms the insulating film may be removed to allow electrical connection by metal vapor deposition.

In the wiring structure of the magnetic wires 21 and 21, the wire input electrode (+) 24 is connected to the upper part of the magnetic wire 21, and the lower part of the magnetic wire 21 is connected to the lower part of the magnetic wire 22 through the wire connection part 23, as illustrated in FIG. 1. The upper part of the magnetic wire 22 is connected to the wire output electrode (−) 25. Thus, wire connection part 23 enables a downward flow of a pulse current from the upper part to the lower part in the magnetic wire 21, and an upward flow of a pulse current from the lower part to the upper part (in the opposite direction from the direction in the magnetic wire 21) in the magnetic wire 22.

In the wiring structure of the coil 3, the coil output electrode (+) 34 is connected to the lower end part of the coil 3, and the upper end part of the coil 3 is connected to a coil ground electrode (−) 35, as illustrated in FIG. 1.

Figure 3:
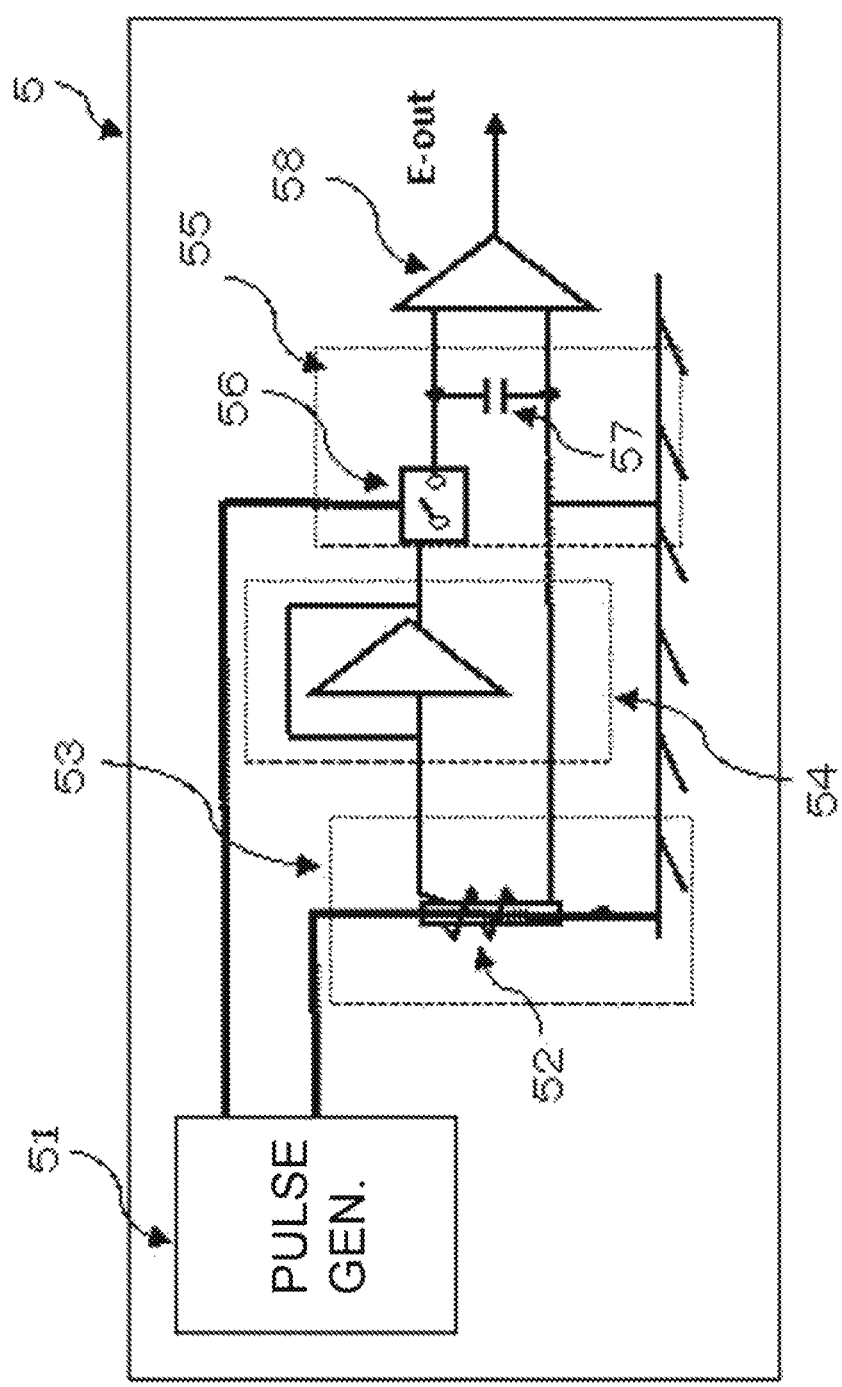
FIG. 3 illustrates an electronic circuit diagram according to an embodiment.

FIG. 3 illustrates an electronic circuit 5 according to some embodiments. Electronic circuit 5 may include a pulse generating circuit 51 for generating a pulse current, an input circuit 53 for receiving a coil voltage, a pulse compliant buffer circuit 54, a sample and hold circuit 55 with an electronic switch 56 for detecting a peak voltage of an output waveform of a coil voltage and a capacitor 57 with a capacitance of about 4 pF to about 100 pF for holding a peak voltage, and an amplifier 58. The amplifier 58 includes a programming amplifier for amplification before analog-to-digital (A/D) conversion.

The GSR sensor element 1 (illustrated, in simplified form, as reference number 52 in FIG. 3) may be connected to output a coil voltage to the electronic circuit 5.

Figure 4:
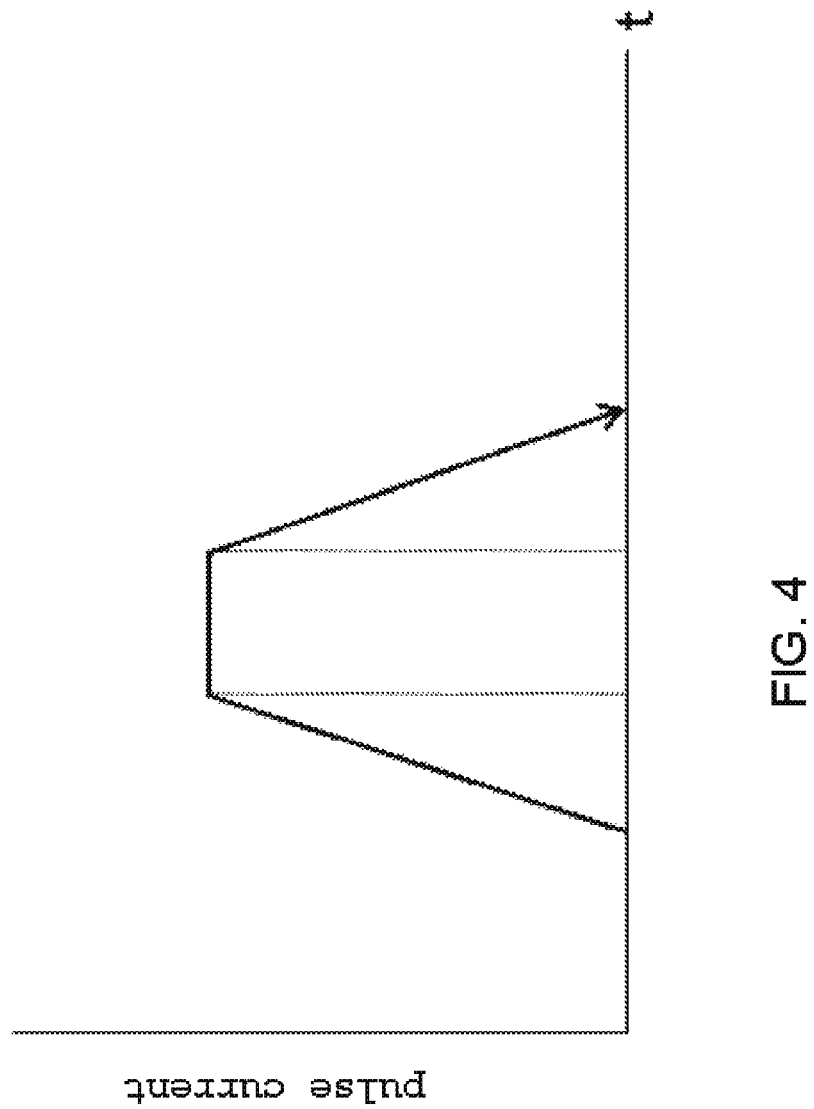
FIG. 4 illustrates a relational diagram between the pulse time and the application of a pulse current according to an embodiment.

At a pulse frequency of a pulse current in the range of about 0.2 GHz to about 4 GHz, the pulse current strength is in the range of about 50 mA to about 200 mA and the pulse time is in the range of about 0 ns to 2 ns. FIG. 4 illustrates the relation between the elapse of energizing time and the application of a pulse current when the pulse current is applied to the GSR sensor element 1. In the example of FIG. 4, the pulse current rises in approximately 0.5 ns from the start of energization, and this applied state is kept for given pulse time of about 0.5 ns. Once such energization is cut off, the pulse current falls in about 0.5 ns.

Figure 5:
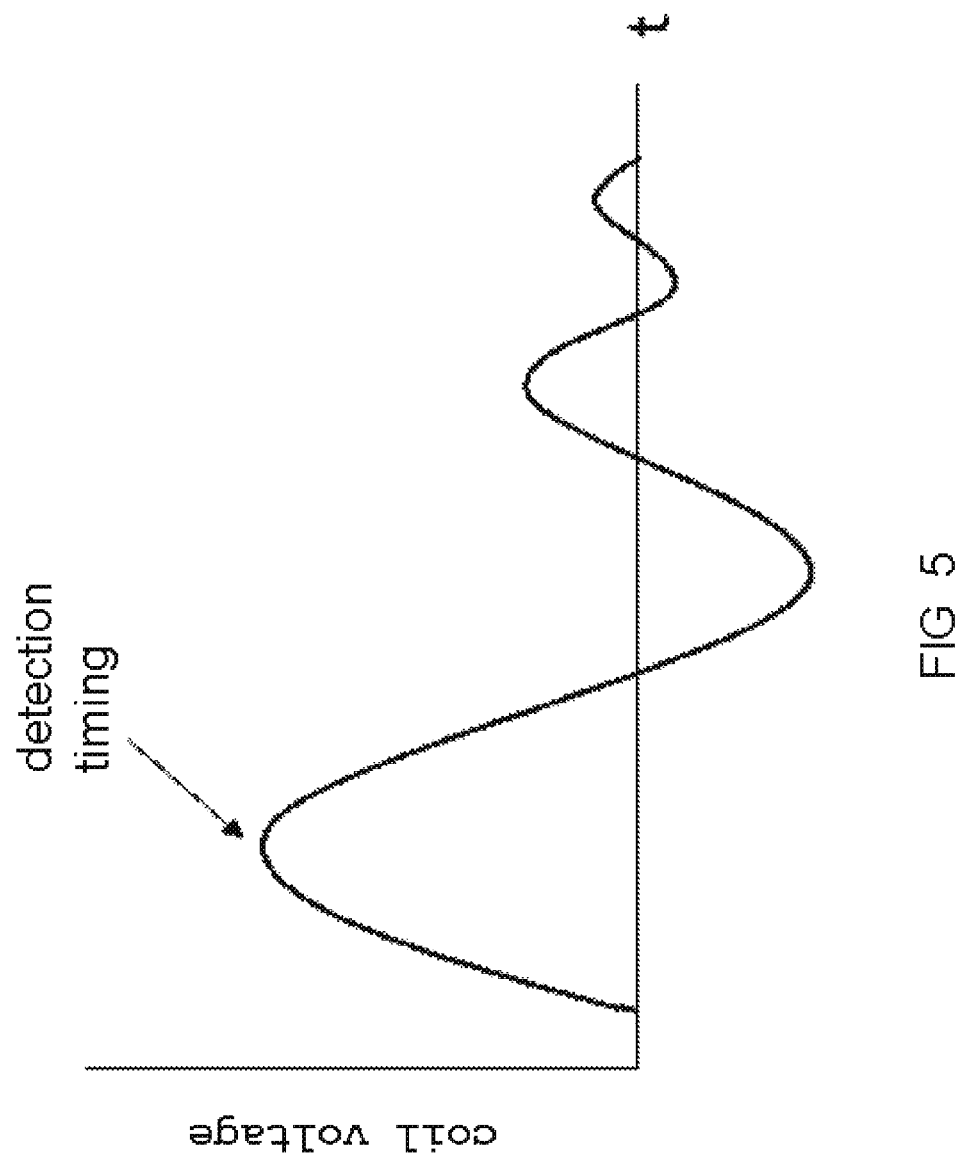
FIG. 5 illustrates an example waveform of a coil voltage when a pulse current is applied according to an embodiment.

FIG. 5 illustrates an example waveform of a coil voltage when the above-described pulse current is applied according to an embodiment.

In an embodiment, the timing of a peak coil voltage, such as that illustrated in FIG. 5, is detected. The electronic switch 56 (FIG. 3) may be turned on and off repeatedly with an opening-closing time in the range of about 0.1 ns to about 1.5 ns.

Referring again to FIG. 3, the capacitance of capacitor 57 of the sample and hold circuit 55 may be in the range of about 4 pF to about 100 pF, and the resolution of the A/D conversion may be in the range of about 14 to about 16 bits. Note that to shorten the interval of the on and off cycles of the electronic switch 56, the capacitance of capacitor 57 is preferably in the range of about 4 pF to 8 pF.

Figure 6:
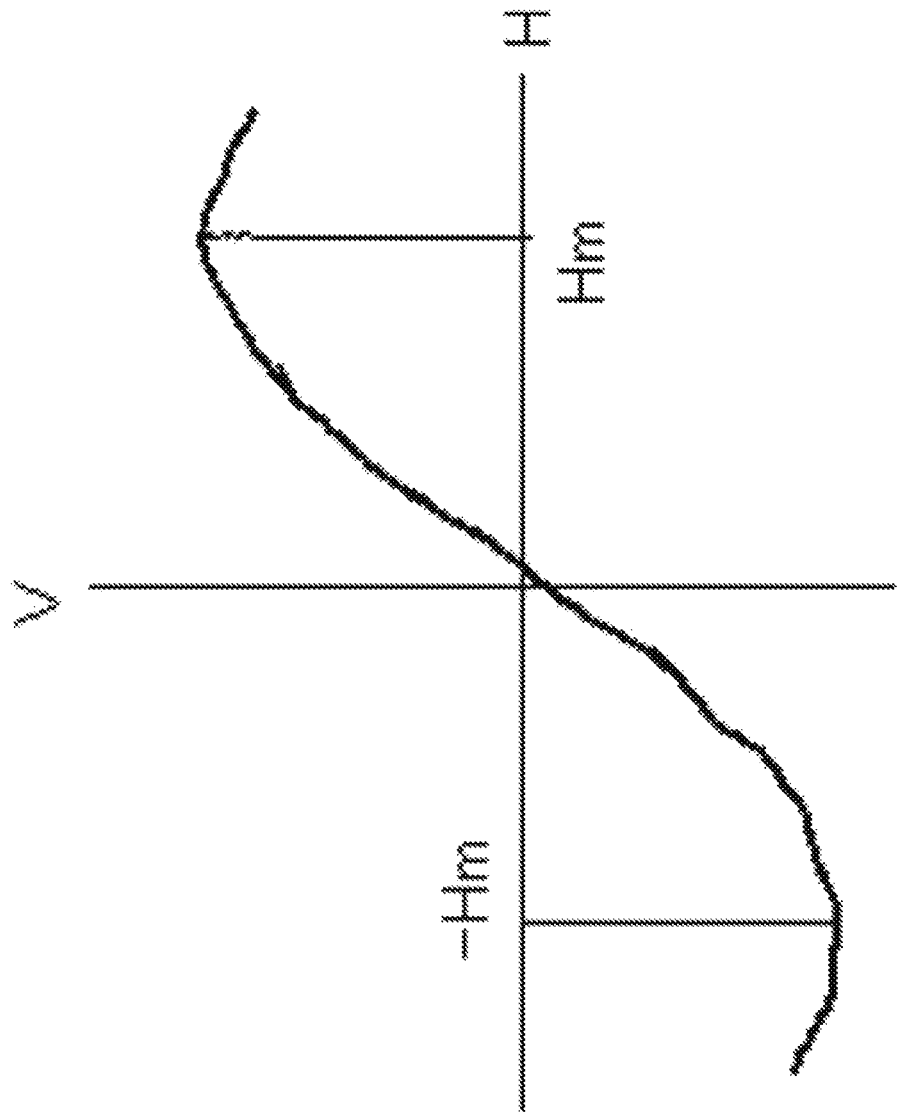
FIG. 6 illustrates an output waveform according to an embodiment.

In the coil output, the sensitivity may be in the range of about 50 mV/G to about 3 V/G in the measurement range of 3 G to 100 G with a sine wave output, as illustrated in FIG. 6. The linearity may be 0.3% or less.

EXAMPLE

An example embodiment is described below. As described in detail above, FIG. 1 illustrates a plane view of a GSR sensor element 1 according an embodiment. FIG. 2 illustrates a section view thereof. FIG. 5 illustrates an electronic circuit that may be used to drive the GSR sensor element 1 and detect the coil voltage. The GSR sensor of an embodiment includes the GSR sensor element 1 having the two magnetic wires 21 and 22, the one coil 3 wound around the two magnetic wires 21 and 22, the two electrodes 24 and 25 for wire energization, and the electrodes 34 and 35 for coil voltage detection, circuitry configured to apply a pulse current to the magnetic wires 21 and 21, circuitry configured to detect a coil voltage occurring when a pulse current is applied, and circuitry configured to convert a coil voltage into an output voltage representing the magnitude of the external magnetic field H. The external magnetic field H and the coil voltage are expressed in the mathematical relation shown in expression (1) above.

In the example embodiment, the size of the element 1 is 0.12 mm in length and 0.20 mm in width. The groove 11 on the substrate 10 is 40 μm in width and 8 μm in depth. The interval between magnetic wires 21 and 21 is 3 μm.

In the example embodiment, the magnetic wire 21 and 22 is formed of a CoFeSiB amorphous alloy coated with glass of 10 μm in diameter and 1 μm or smaller in thickness and the magnetic anisotropy field is 15G.

In the example embodiment, the number of windings of coil 3 is 14 with a coil pitch of 5 μm. The average inner diameter of coil 3 is 30 μm, and the interval between coil 3 and the magnetic wires 21 and 22 is 2 μm.

In the example embodiment, the magnetic wires 21 and 22, coated with glass, are recessed half way (half the diameter) into the groove 11 formed on the substrate 10. The lower coil 31 is arranged on the inner surface of the groove 11, and the upper coil 32 is arranged above the magnetic wires. The lower coil 31 and the upper coil 32 are fixed with insulating resin and connected by interconnection part 33 on the substrate surface.

Between the end parts of the coil 3 and each of the coil electrodes 34 and 35, electrical connection is provided using a conductive metal vapor deposition film.

In the magnetic wires 21 and 22 and the electrodes, after removing the glass coating material on the upper surface part at the end part of the magnetic wires 21 and 22, electrical connection is provided using a conductive metal vapor deposition film between the wire surface with the coating removed and the electrodes 24 and 25.

Moreover, the connection part 23 between the two magnetic wires 21 and 22 is also subjected to electrical connection by the same processing.

In the example embodiment, the GSR sensor element 1 is provided in the electronic circuit 5 and is energized by the pulse generation circuit 51 with a pulse width of 0.8 ns at a pulse frequency of 1 GHz and a pulse current strength of 120 mA. The interval of the on/off cycle of the electronic switch 56 is 0.2 ns. The capacitance of capacitor 57 of the sample and hold circuit 55 is 6 pF.

In the example embodiment, 16 bits resolution is obtained by A/D conversion. Moreover, with the sine wave output, the sensitivity is 200 mV in the measurement range of 90G. With the above parameters for the example embodiment, the power consumption is approximately 0.3 mW, and the linearity is approximately 0.2%.

Advantageous Effects of the Disclosure

The rising pulse detection type GSR sensor may achieve, with the same element size, five times the magnetic field detection sensitivity and 10% or less power consumption (compared to falling pulse detection), enabling considerable downsizing of the magnetic sensor with an in vivo motion device.

An embodiment of the disclosure is described as follows.

Note that one or two or more configurations arbitrarily selected from the specification may be added to the configuration of the disclosure. The most preferable embodiment varies depending on a subject and required characteristics.

A GSR sensor that is a ultra high-sensitivity micro magnetic sensor according to an embodiment includes a magnetic field detection element including two conductive magnetic wires for magnetic field detection arranged adjacent to each other on a substrate, a round coil wound around the two magnetic wires, two electrodes for wire energization, and two electrodes for coil voltage detection, a means for applying a pulse current to the magnetic wires, a circuit for detecting a coil voltage occurred when the pulse current is applied to the magnetic wires in opposite directions, and a means for converting the coil voltage into an external magnetic field H, in which the magnetic wire has a magnetic anisotropy field of 20 G or less, with a two-phase magnetic domain structure of a surface magnetic domain with circumferential spin alignment and a center core magnetic domain with longitudinal spin alignment, and the pulse current applied to the magnetic wire has a pulse frequency of 0.2 GHz to 4 GHz and a strength required to generate over a 1.5 times larger circumferential magnetic field than the anisotropy field on a surface of the wire, and the coil has a coil pitch of 10 μm or less. The average inner diameter of the coil is preferably 35 μm or smaller.

In the case where a plurality of pairs of wires are arranged, the interval between the coil and the magnetic wire is preferably 1 μm to 5 μm.

Moreover, in the GSR sensor that is the ultra high-sensitivity micro magnetic sensor according to an embodiment, the pulse current is applied to the magnetic wire, and the circumferential spin inclined in an axial direction is subjected to super high speed rotation by a wire axial magnetic field in the surface magnetic domain, to take out only a magnetization change in the wire axial direction due to a super high speed rotation phenomena occurred at the rotation and perform conversion into a field H using equation (1) above:

Furthermore, the GSR sensor that is the ultra high-sensitivity micro magnetic sensor according to an embodiment further includes an electronic circuit including a pulse generating circuit for generating the pulse current, an input circuit for inputting a coil voltage, a pulse compliant buffer circuit, a sample hold circuit with an electronic switch 56 for detecting a peak voltage of an output waveform of the coil voltage and a capacitor with a capacitance of 4 to 100 pF for holding the peak voltage, and an programming amplifier for amplification before A/D conversion.

INDUSTRIAL APPLICABILITY

The embodiments of the disclosure achieve higher sensitivity and lower power consumption of the GSR sensor. These embodiments are expected to be used when ultra small size and high performance are required such as in an in vivo motion device.

REFERENCE NUMBER LIST

1 GSR sensor element
10 substrate
11 groove
2 magnetic wire
21 one of two magnetic wires 22 the other of two magnetic wires
23 wire connection part
24 wire input electrode (+)
25 wire output electrode (−)
3 coil
31 lower coil
32 upper coil
33 interconnection part
34 coil output electrode (+)
35 coil ground electrode (−)
4 insulating resin
41 insulating separation wall
5 electronic circuit
51 pulse generation circuit
52 GSR sensor element
53 input circuit
54 buffer circuit
55 sample and hold circuit
56 electronic switch
57 capacitor
58 amplifier

The invention claimed is:

1. A magnetic sensor, comprising:
a substrate having a groove;
two conductive magnetic wires for magnetic field detection arranged adjacent and substantially parallel to one another and at least partially recessed in the groove on the substrate, the two conductive magnetic wires electrically coupled at one end;
a coil including a lower part and a upper part and surrounding the two magnetic wires;
two electrodes coupled to the two conductive magnetic wires for wire energization; and
two electrodes coupled to the coil for coil voltage detection, wherein
the two conductive magnetic wires have a two-phase magnetic domain structure of a surface magnetic domain with circumferential spin alignment and center core magnetic domain with longitudinal spin alignment,
the two conductive magnetic wires are arranged over the lower part of the coil, and are fixed and covered by an insulating resin, and
the upper part of the coil is provided on the insulating resin.

2. The magnetic sensor of claim 1, wherein the two conductive magnetic wires are formed of a CoFeSiB amorphous alloy with a diameter in the range of about 5 μm to about 20 μm and the length of each of the two conductive magnetic wires is in the range from about 0.07 mm to about 1.0 mm.

3. The magnetic sensor of claim 1, wherein the two conductive magnetic wires have a magnetic anisotropy field of 20 G or less.

4. The magnetic sensor of claim 1, wherein the coil as a coil pitch of 10 μm or less.

5. The magnetic sensor of claim 1, wherein the number of windings of the coil is in the range from about 6 to about 180.

6. The magnetic sensor of claim 1, wherein the space between the coil and the two conductive magnetic wires is about 3 μm or less.

7. The magnetic sensor of claim 1, wherein the upper part of the coil is provided on the insulating resin using photolithography.

8. The magnetic sensor of claim 1, further comprising:
a pulse current applying circuit configured to apply a pulse current to the magnetic wires;
a coil voltage detecting circuit configured to detect a coil voltage occurred when the pulse current is applied to the two magnetic wires; and
a voltage converting circuit configured to convert the coil voltage into an external magnetic field H.

9. The magnetic sensor of claim 8, wherein
the pulse current applied to the magnetic wires has a pulse frequency of 0.2 GHz to 4.0 GHz, and has a strength required to generate over a 1.5 times larger circumferential magnetic field than the anisotropy field on a surface of the wire.

10. The magnetic sensor of claim 8, wherein
the voltage converting circuit is configured to convert the coil voltage into the external magnetic field H using an equation:

$$Vs = Vo \cdot 2L \cdot \pi D \cdot p \cdot Nc \cdot f \cdot \sin(\pi H/2Hm),$$

where Vs is a coil output voltage and Vo is a constant of proportionality, and as a control factor constant, L is a wire length, D is a wire diameter, is a skin depth of a pulse current, Nc is number of winding of a coil, f is a pulse frequency, and Hm is an external magnetic strength to obtain a maximum coil output voltage.

11. The magnetic sensor of claim 8, wherein
the pulse current applying circuit comprises a pulse generating circuit configured to generate the pulse current, and
the coil voltage detecting circuit comprises an input circuit, a pulse compliant buffer circuit configured to input the coil voltage, a sample hold circuit with an electronic switch configured to detect a peak voltage of an output waveform of the coil voltage, a capacitor with a capacitance of 4 to 100 pF configured to hold the peak voltage, and an programming amplifier configured to perform amplification before AD conversion.

12. A magnetic sensor, comprising:
a magnetic field detection element including two conductive magnetic wires for magnetic field detection arranged adjacent to one another on a substrate, a coil including a lower part and a upper part and surrounding the two conductive magnetic wires, two electrodes coupled to the two conductive magnetic wires for wire energization, and two electrodes coupled to the coil for coil voltage detection;
first circuitry electrically coupled to the two electrodes for energization of the two conductive magnetic wires configured to apply a pulse current to the two conductive magnetic wires in opposite directions;
second circuitry electrically coupled to the two electrodes for coil voltage detection configured to detect a coil voltage when the pulse current is applied to the two magnetic wires; and
third circuitry electrically coupled to the second circuitry configured to convert the coil voltage into a voltage representing the magnitude of an external magnetic field H, wherein
the two conductive magnetic wires have a two-phase magnetic domain structure of a surface magnetic domain with circumferential spin alignment and a center core magnetic domain with longitudinal spin alignment,
the two conductive magnetic wires are arranged over the lower part of the coil, and are fixed and covered by an insulating resin, and the upper part of the coil is provided on the insulating resin.

13. The magnetic sensor of claim 12, wherein the two conductive magnetic wires have a magnetic anisotropy field of 20 G or less.

14. The magnetic sensor of claim 12, wherein the pulse current applied to the two conductive magnetic wires has a pulse frequency in the range of 0.2 GHz to 4.0 GHz.

15. The magnetic sensor of claim 12, wherein the pulse current applied to the two conductive magnetic wires has the strength required to generate over a 1.5 times larger circumferential magnetic field than the anisotropy field on a surface of the two conductive magnetic wires.

16. The magnetic sensor of claim 12, wherein the coil has a coil pitch of 10 μm or less.

17. The magnetic sensor of claim 12, wherein the third circuitry is further configured to:
 detect a peak of the coil voltage,
 hold the peak voltage, and
 amplify the held peak voltage.

18. The magnetic sensor of claim 12, wherein the upper part of the coil is provided on the insulating resin using photolithography.

* * * * *